United States Patent
Baselmans et al.

(10) Patent No.: US 7,242,475 B2
(45) Date of Patent: Jul. 10, 2007

(54) METHOD OF DETERMINING ABERRATION OF A PROJECTION SYSTEM OF A LITHOGRAPHIC APPARATUS

(75) Inventors: Johannes Jacobus Matheus Baselmans, Oirschot (NL); Haico Victor Kok, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 217 days.

(21) Appl. No.: 10/808,598

(22) Filed: Mar. 25, 2004

(65) Prior Publication Data

US 2005/0213097 A1 Sep. 29, 2005

(51) Int. Cl.
*G01B 11/00* (2006.01)

(52) U.S. Cl. .................................................. 356/399

(58) Field of Classification Search ........ 356/399–401; 355/53, 43; 250/548, 205
See application file for complete search history.

(56) References Cited

U.S. PATENT DOCUMENTS

| 5,828,455 | A | 10/1998 | Smith et al. | |
|---|---|---|---|---|
| 6,245,470 | B1 * | 6/2001 | Kamon | 430/30 |
| 6,304,317 | B1 * | 10/2001 | Taniguchi et al. | 355/55 |
| 6,437,858 | B1 * | 8/2002 | Kouno et al. | 356/124 |
| 6,509,956 | B2 * | 1/2003 | Kobayashi | 355/55 |
| 6,590,634 | B1 * | 7/2003 | Nishi et al. | 355/53 |
| 6,833,906 | B1 * | 12/2004 | Ohsaki | 355/69 |
| 2002/0057495 | A1 | 5/2002 | Kuramoto | |
| 2003/0123052 | A1 | 7/2003 | Ausschnitt et al. | |
| 2003/0197865 | A1 | 10/2003 | Shiode | |

OTHER PUBLICATIONS

"Measurement of Aberrations" Research Disclosure, Kenneth Mason Publications, Westbourne, GB, vol. 440, No. 16, Dec. 2000, XP007127201.

* cited by examiner

*Primary Examiner*—Gregory J. Toatley, Jr.
*Assistant Examiner*—Isiaka O. Akanbi
(74) *Attorney, Agent, or Firm*—Pillsbury Winthrop Shaw Pittman LLP

(57) ABSTRACT

A method of determining aberration of a projection system of a lithographic includes projecting a reference test pattern, projecting a second test pattern, measuring relative displacements between items in the resulting images of said reference test pattern and said second test pattern, and using said measurements to determine information on the aberration of the projection system, wherein a filter is used when imaging the second test pattern to select particular radiation paths though the projection system, and wherein the measuring is performed for a plurality of images of the second test pattern obtained at planes displaced along the optical axis relative to each other.

19 Claims, 3 Drawing Sheets

METHOD OF DETERMINING ABERRATION OF A PROJECTION SYSTEM OF A LITHOGRAPHIC APPARATUS

FIELD OF THE INVENTION

The present invention relates to a method of measuring wave front aberrations of a projection system in lithographic apparatus.

BACKGROUND OF THE INVENTION

A lithographic apparatus is a machine that applies a desired pattern onto a target portion of a substrate. Lithographic apparatus can be used, for example, in the manufacture of integrated circuits (ICs). In that circumstance, a patterning structure, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

There is a desire to integrate an ever-increasing number of electronic components in an IC. To achieve this it is necessary to decrease the size of the components and therefore to increase the resolution of the projection system which images the pattern of the mask onto the substrate. Increasing the resolution of the projection system can enable increasingly smaller details, or line widths, to be projected on a target portion of the substrate. This means that the projection system and the lens elements used in the projection system must comply with very stringent quality requirements. Despite the great care taken during the manufacturing of lens elements and the projection system, the projection system may still suffer from wave front aberrations, such as, for example, displacement, defocus, astigmatism, coma and spherical aberration. Such aberrations are important sources of variations of the imaged line widths occurring across the image field. It is important that the imaged line width at different points within the image field are substantially constant. If the line width variation is large, the substrate on which the image field is projected may be rejected during a quality inspection of the substrate. Using techniques such as phase-shifting masks or off-axis rumination, the influence of wave front aberrations on the imaged line-widths may further increase.

Therefore, it is important to be able to measure the wave front aberrations of the projection system accurately to ensure that the stringent imaging quality requirements are satisfied or, if necessary, to control the reduction of the aberration (for example the position of certain lens elements in the projection system may be adjusted in order to minimize wave front aberrations). Some techniques are known for measuring wave front aberrations, as will be described in more detail below; these techniques can suffer from systematic errors and hence limitation in accuracy. They also suffer from the problem of strict tolerance in the positioning of certain elements when imaging test patterns which can be difficult and/or expensive.

SUMMARY OF THE INVENTION

According to one aspect of the present invention, there is provided a method of determining aberration of a projection system of a lithographic apparatus, the lithographic apparatus including, an illumination system for providing a projection beam of radiation, a support structure for supporting patterning structure, the patterning structure serving to impart the projection beam with a pattern in its cross-section, a substrate table for holding a substrate, and a projection system for projecting the patterned beam onto a target portion of the substrate, said method including, projecting a reference test pattern, projecting a second test pattern, measuring relative displacements between items in the resulting images of said reference test pattern and said second test pattern, and using said measurements to determine information on the aberration of the projection system, wherein a filter is used when imaging the second test pattern to select particular radiation paths though the projection system, and wherein the measuring is performed for a plurality of images of the second test pattern obtained at planes displaced along the optical axis relative to each other.

This method enables the aberration to be determined because the assumed path of radiation through the projection system is not based on the simple geometrical optics model.

According to another aspect of the present invention, there is provided a method of determining aberration of a projection system of a lithographic apparatus, the lithographic apparatus including, an illumination system for providing a projection beam of radiation, a support structure for supporting patterning structure, the patterning structure serving to impart the projection beam with a pattern in its cross-section, a substrate table for holding a substrate, and a projection system for projecting the patterned beam onto a target portion of the substrate, said method including, projecting a reference test pattern, projecting a second test pattern, measuring relative displacements between items in the resulting images of said reference test pattern and said second test pattern, and using said measurements to determine information on the aberration of the projection system, wherein a filter is used when imaging the second test pattern to select particular radiation paths though the projection system, and wherein the coordinates of the filter are included as variable parameters in the calculations for determining the aberration information.

This method enables the tolerance on the positioning of the filter to be relaxed because it is taken into account in the modeling, and so it may be cheaper to implement. The aberration can be determined by reducing effects of a systematic error in the assumed position of the filter.

According to a further aspect of the invention, there is provided a method of determining aberration of a projection system of a lithographic apparatus, the lithographic apparatus including, an illumination system for providing a projection beam of radiation, a support structure for supporting patterning structure, the patterning structure serving to impart the projection beam with a pattern in its cross-section, a substrate table for holding a substrate, and a projection system for projecting the patterned beam onto a target portion of the substrate, said method including, projecting a reference test pattern, projecting a second test pattern, measuring relative displacements between items in the resulting images of said reference test pattern and said second test pattern, and using said measurements to determine information on the aberration of the projection system, wherein a filter is used when imaging the second test pattern to select particular radiation paths though the projection system, and wherein the spherical aberration introduced by the filter is included as a variable parameter in the calculations for determining the aberration information.

This method enables the aberration to be determined because the systematic extra shifts introduced by the inherent spherical aberration of the filter can be substantially calibrated out.

A further aspect of the invention provides a device manufacturing method including, providing a substrate, providing a projection beam of radiation using an illumination system, using patterning structure to impart the projection beam with a pattern in its cross-section, and projecting the patterned beam of radiation onto a target portion of the substrate, determining the aberration of the projection system according to the method of any one of the previous aspects of the invention, and correcting for said aberration to reduce the aberration of the patterned beam projected onto the target portion of the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE PREFERRED EMBODIMENTS

Figure 1:
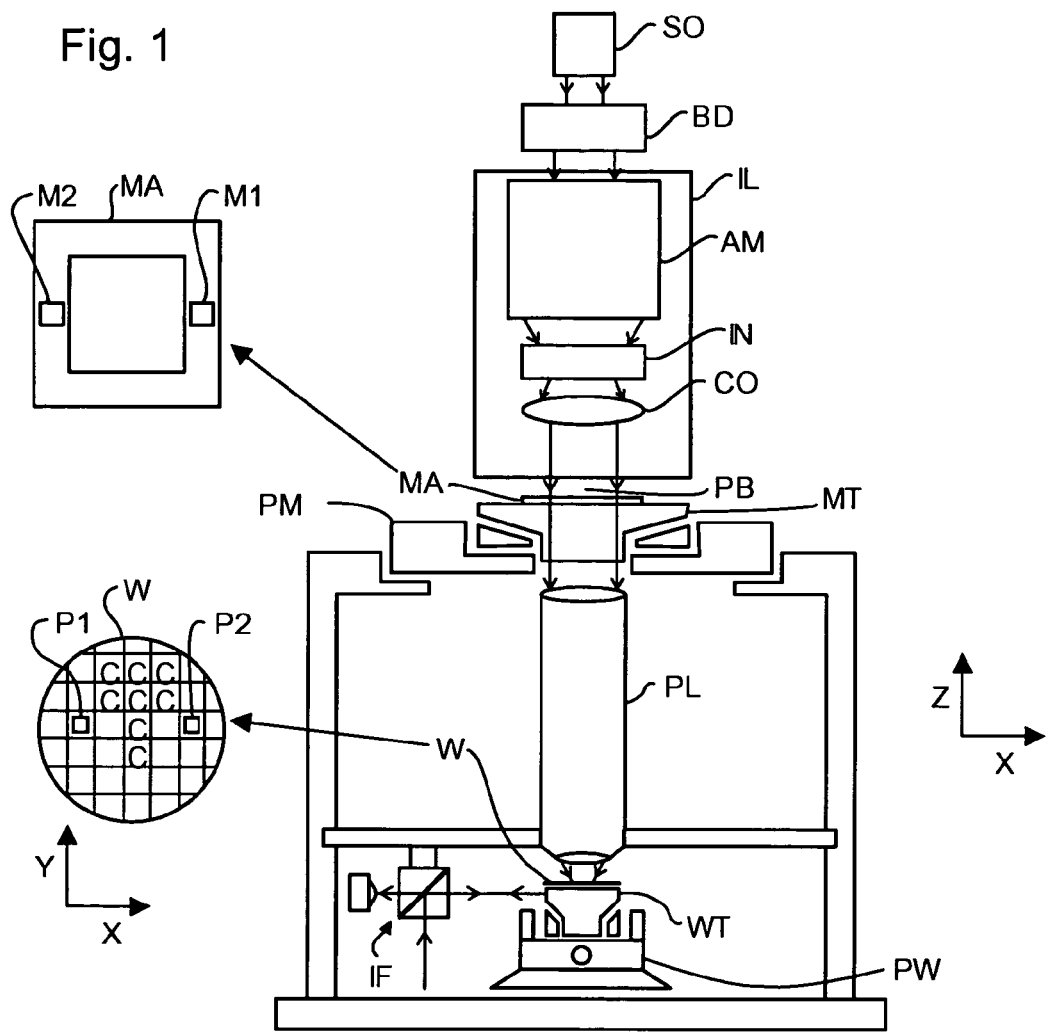
FIG. 1 depicts a lithographic apparatus according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning structure" used herein should be broadly interpreted as referring to means that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning structures may be transmissive or reflective. Examples of patterning structures include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning structure, the support structure may be a frame or table, for example, which may be fixed or movable as required and which may ensure that the patterning structure is at a desired position, for example with respect to the projection system. Any use of the terms "reticle" or "mask" herein may be considered synonymous with the more general term "patterning structure".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

FIG. 1 schematically depicts a lithographic apparatus according to a particular embodiment of the invention. The apparatus includes:

an illumination system (illuminator) IL for providing a projection beam PB of radiation (e.g. UV radiation or EUV radiation);

a first support structure (e.g. a mask table) MT for supporting patterning structure (e.g. a mask) MA and connected to first positioning device PM for accurately positioning the patterning structure with respect to item PL;

a substrate table (e.g. a wafer table) WT for holding a substrate (e.g. a resist-coated wafer) W and connected to second positioning device PW for accurately positioning the substrate with respect to item PL; and a projection system (e.g. a refractive projection lens) PL for imaging a pattern imparted to the projection beam PB by patterning structure MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjustable optical elements means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations and/or variations on the above described modes of use or entirely different modes of use may also be employed.

Figure 2:
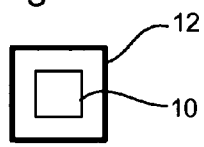
FIGS. 2, 3 and 4 illustrate examples of test pattern exposures for use with embodiments of the present invention.
Figure 3:
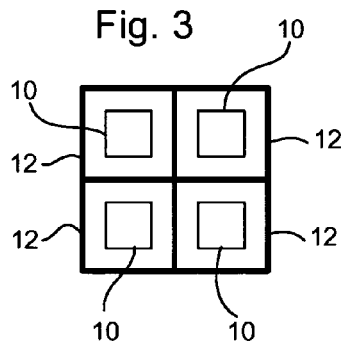

In order to assist the understanding of the present invention, an earlier technique and its limitations will now be described with reference to FIGS. 2 to 6. Essentially in this technique, two test patterns are separately exposed under different conditions as will be explained below. The first test pattern serves as a reference pattern and according to one example is composed of a plurality of small squares, known as inner frames 10, as shown in FIG. 2; and the second test pattern comprises a set of larger squares, known as outer frames 12. Each test pattern comprises an array of either inner or outer frames and may be arranged such that the outer frames 12 touch their neighboring outer frames along their edges as shown in FIG. 3. Each outer frame 12 is approximately concentric with a respective inner frame 10 as shown in FIGS. 2 and 3. However, because the two test patterns are imaged under different conditions, as explained below, there can be a displacement of each outer frame 12 with respect to its inner frame 10, and by measuring this displacement, information on the wave front aberration of the projection system can be obtained. The reason for this is that a local aberration of the wave front in the projection system is manifest as a local tilt of the wave front which results in a shift of the image generated by that particular local portion of the wave front. Thus the shift of the image can be related to the wave front aberration.

Figure 4:
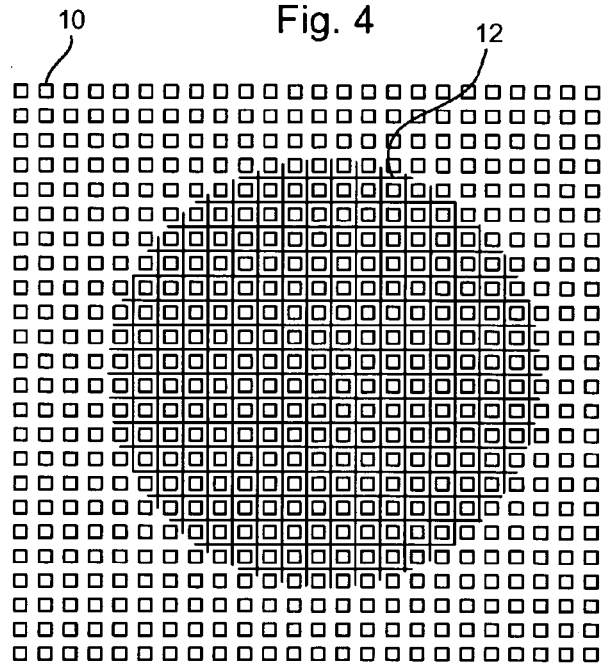

FIG. 4 shows a complete exposure of the first and second test patterns as it might appear when imaged on a resist-coated wafer. It consists of a square array of inner frames 10 and a substantially circular patch of outer frames 12. For clarity, only one inner frame 10 and one outer frame 12 have been labeled in FIG. 4.

Figure 5:
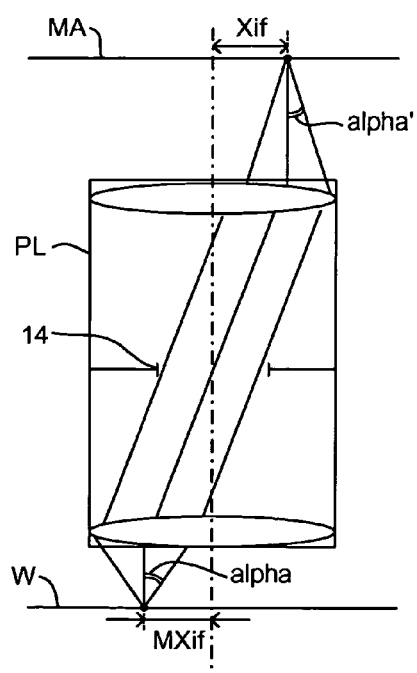
FIGS. 5 and 6 are diagrammatic cross-sections of a projection system illustrating the imaging of first and second test patterns, respectively.

The imaging condition for the first test pattern of inner frames 10 is illustrated in FIG. 5. The first test pattern is present on a mask MA which is imaged on to a substrate W under normal imaging conditions with the substrate W located at the plane of best focus of the image of the masked MA produced by the projection system PL. An inner frame at location $X_{if}$ is imaged at position $MX_{if}$, where M is the magnification of the projection system, which is typically less than 1, such as ¼. The projection system PL has a pupil 14 at a pupil plane. The light intensity distribution at the pupil plane is essentially the fourier transform of the pattern on the mask MA being imaged on the substrate W. The imaging of each inner frame of the first test pattern uses the full width of the pupil 14 as shown diagrammatically by the ray lines in FIG. 5. On the wafer side of the projection lens PL, the extreme rays contributing to the imaging at a point on the substrate W define a cone of semi-angle alpha, and therefore the numerical aperture NA=sin(alpha). At the mask side the cone angle alpha'=M×alpha.

Figure 6:
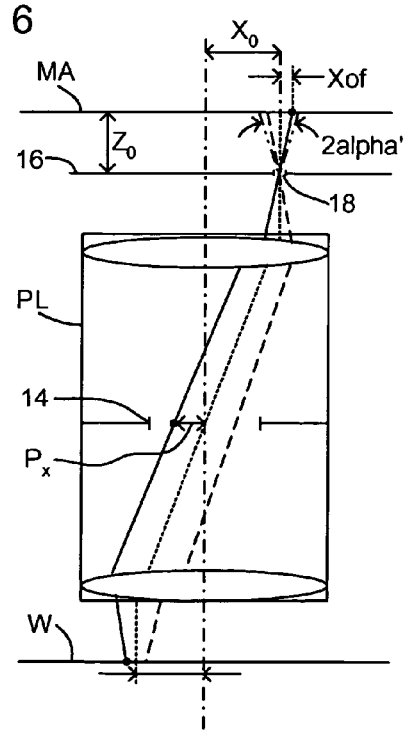

FIG. 6 illustrates the imaging conditions for the second test pattern of outer frames 12. In this case a filter 16 is positioned a predetermined distance $Z_o$ beneath the mask MA. In this example the filter is a pinhole 18 in an otherwise opaque member, such as an aperture in a thin metal plate. The size of the pinhole 18 can be approximately the same size as one of the outer frames 12, and the thickness of the plate is generally substantially less than the width of the pinhole. In FIG. 6, the pinhole 18 is centered on position $X_o$ relative to the optical axis of the projection system PL. For simplicity, FIGS. 5 and 6 are cross-sections in the XZ plane, but it is, of course, understood that the location of the pinhole 18 and of the test patterns being imaged can be anywhere in the XY plane. The pupil 18 acts as a filter such that only radiation from a measurement area on the mask MA which subtends an angle (2×alpha') at the pinhole 18 will pass through the projection system PL because of the numerical aperture of the projection system. Next, for each point in that measurement area on the mask MA, the rays which pass through the pinhole 18 will transverse a unique path through the projection system PL. In contrast, as shown in FIG. 5, the rays from a particular point on the mask MA can take many routes through the projection system PL and fill the entire pupil 14. In FIG. 6, for an outer frame at position $X_{of}$ relative to the pinhole 18, the radiation from the vicinity of that outer frame which reaches the substrate W can only take one path through the projection system PL shown by the solid ray line. Rays from different outer frames will take different paths through the projection system PL, for example, as shown by the dashed and dotted ray lines in FIG. 6. Thus the pinhole 18 acts as a filter such that rays from each outer frame select their own unique path through the projection system PL. For the second test pattern exposure, the exit pupil of the illumination system should fully fill entrance pupil of the projection lens.

For an outer frame at position $X_{of}$ with respect to a pinhole 18 centered at $X_o$, the path of the radiation from that outer frame through the projection system PL can be characterized by the coordinate $p_x$ at which it passes through the pupil 14. From simple geometrical considerations, the pupil coordinate $p_x$ is given by the following equation:

$$p_x = \sin[\tan^{-1}(X_{of}/Z_0)]/\sin(alpha') \quad (1)$$

More generally, for an outer frame centered at coordinates $(X_{of}, Y_{of})=R$, the corresponding pupil coordinates are given by:

$$P = \frac{R}{|R|}\sin[\tan^{-1}(|R|/Z_0)]/\sin(alpha') \quad (2)$$

i.e.

$$p_X = \frac{X_{of}}{|R|}\sin[\tan^{-1}(|R|/Z_0)]/\sin(alpha')$$

and $$p_Y = \frac{Y_{of}}{|R|}\sin[\tan^{-1}(|R|/Z_0)]/\sin(alpha')$$

where $$|R| = \sqrt{X_{of}^2 + Y_{of}^2}$$

These expressions are normalized such that the radius of the pupil is 1. These expressions are the geometrical optics prediction for the pupil position of a ray.

A wave front aberration locally present for a particular path through the projection system will result in a tilt with respect to the ideal wave front, which causes a displacement of the image of the outer frame. There is potentially a different displacement for each outer frame because of the different path and hence different local aberration experienced. Each inner frame is imaged using the full numerical aperture of the projection lens (projection lens pupil width), thus all inner frames will experience the same aberrations. Therefore, instead of a local tilt per frame, all inner frames see the same global tilt, which will result in a global displacement of the full pattern. Therefore any displacement of an outer frame image with respect to an inner frame image can be translated into a wave front aberration. The lowest order aberrations (offset and tilt) cannot be obtained by this technique because they result in a global displacement of the full pattern of inner frames.

In practice, the first and second test patterns of inner and outer frames are exposed on a resist-coated substrate which is then analyzed in a separate apparatus off-line from the lithographic projection apparatus. The resist may be developed to enable the exposed images to be observed, or it may be possible to observe the latent images in the resist. It is also possible to use a camera device, such as a CCD or CMOS camera, to capture electronically the images, without using a resist. The electronic data corresponding to the images may then be analyzed in a computer independent of the lithographic projection apparatus.

An example of an exposure of first and second test patterns of inner and outer frames as it might appear when imaged on a resist-coated wafer is given in FIG. 4. The approximately circular region of outer frames 12 corresponds to the footprint of the pencil of rays that has passed through the pupil 18. In other words, the disc of outer frames is an out-of-focus image of the pupil 18. In one example, the size of the first test pattern of inner squares 10 in FIG. 4 might be approximately 600 microns by 600 microns and represents a particular measurement area at mask level within which the circular area subtending the angle 2×alpha' at the pinhole 18 is located. For an exposure such as FIG. 4, the value of the displacement is measured at about 250 locations within the measurement area corresponding to the positions of the approximately 250 outer frames that are visible. Typically, about 30 such sets of measurements are performed corresponding to ten columns (through the slit) by three rows (in the scan direction).

The dimension of each outer frame 12 in the image at the substrate level is approximately 25 microns. The distance $Z_0$ between the filter 16 and the level of the mask MA is approximately 5 mm.

As explained previously, aberration of the projection system causes a tilt of the wave front and hence a displacement of the image. The measured displacement is equal to the derivative of the wave front and can be related mathematically as follows:

$$(dX(k,l), dY(k,l)) = \left(\frac{\partial}{\partial X}WF(p_X(k,l), p_Y(k,l)), \frac{\partial}{\partial Y}WF(p_X(k,l), p_Y(k,l))\right) \quad (3)$$

where k and l are simply indexes labeling each outer frame;
dX, dY is the displacement of the outer frame measured with respect to the inner frame;
$\partial/\partial X$ and $\partial/\partial Y$ are partial derivatives in the X and Y directions respectively;
WF is the wave front at pupil location ($p_X$, $p_Y$); and
($p_X$, $p_Y$) is the pupil location corresponding to frame index as k, l.

The aberrated wave front can be described by Zernike polynomials; that is the wave front can be expressed as the sum of a series of polynomial functions, the contribution of each function being scaled by a respective Zernike coefficient. The Zernike polynomials are polynomial functions of the radial coordinate and also include an angular dependency. Each Zernike polynomial can be identified as representing the contribution of a particular aberration. Thus in Equation 3, the derivatives of the wave front correspond to the derivatives of Zernike polynomials which are themselves another set of polynomials. These derivative polynomials can be fitted to the measured displacements using conventional numerical computation techniques to obtain the Zernike coefficients. The Zernike expansion may be terminated at a selected Zernike polynomial such that, for example, the Zernike expansion is performed up to Zernike number 64. The number is chosen to be sufficiently high such that cross-talk resulting from higher order Zernike coefficients influencing the lower order Zernike coefficients is limited.

Embodiment 1

The first embodiment of the invention arises from the fact that the calculation of the position of a ray traversing the pupil according to geometrical optics as in equations 1 and 2 above may not be entirely valid. Consequently, this leads to errors in the calculated wave front aberration of the lens expressed e.g. as the Zernike coefficients.

Figure 7:
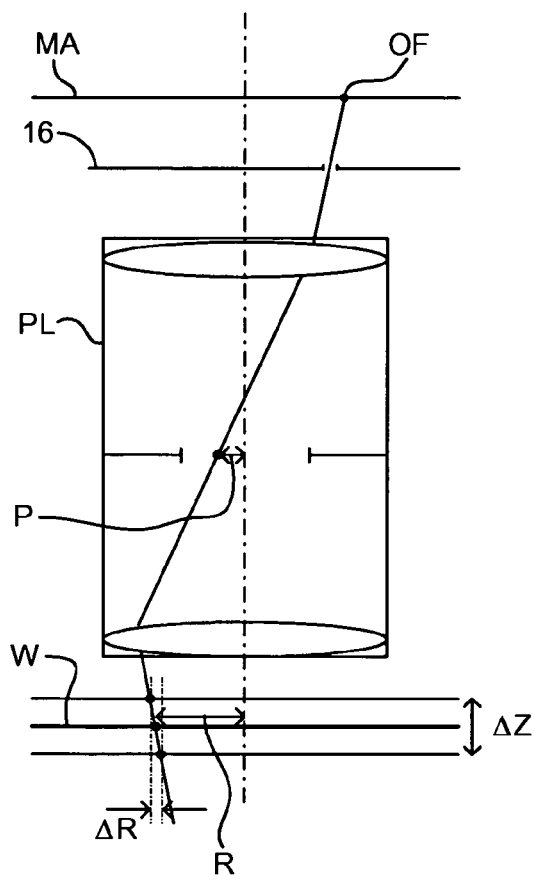
FIGS. 7 and 8 are diagrammatic cross-sections of a projection system for explaining the operation of embodiments of the present invention.

In contrast, according to this embodiment of the invention, the pupil location P traversed by a ray from a particular outer frame can be found by measuring the change of displacement of the image for different focus positions. Referring to FIG. 7, an outer frame OF on the mask MA produces an image at position R on the substrate W when at the plane of best focus. A shift in the position of the wafer in the Z-direction (along the optical axis) by an amount $\Delta Z$ produces a displacement of the image by an amount $\Delta R$. In fact, for an outer frame OF at a particular measurement site, the vector representing the change of displacement through focus points towards the pupil location P it is sampling. The following relation for the pupil location P holds:

$$P = \sin(\tan^{-1}(\partial R/\partial Z))/NA \quad (4)$$

Standard numeric approximations can be used to relate the displacement of the image $\Delta R$ through focus $\Delta Z$ to the gradient at the position of best focus $\partial R/\partial Z$. In the following, $\Delta Z$ will also be written dZ, and the displacement $\Delta R$ will have the components dX and dY.

In more detail, the relation between wavefront W and defocus dZ is:

$$W(\theta) = dZ \cos(\theta) \quad (4.1)$$

with $\theta$ being the angle of the imaging ray with respect to the normal of the defocused surface.

The Pupil coordinate p is given by:

$$p = \sin(\theta)/NA/n \quad (4.2)$$

where NA is the numerical aperture, and n the index of refraction.

The displacement measured at wafer level is given by:

$$dX = dW/dp_x \quad (4.3)$$

$$dY = dW/dp_y$$

Transforming into wafer coordinates yields:

$$dX/dZ = -dZ.p_x.NA^2/(1-p_x^2.NA^2-p_y^2.NA^2)^{1/2} \quad (4.4)$$

$$dY/dZ = -dZ.p_y.NA^2/(1-p_x^2.NA^2-p_y^2.NA^2)^{1/2}$$

which uses the relation:

$$\sin(\theta) = (1-\cos^2(\theta))^{1/2} \quad (4.5)$$

The factors NA are needed because of the normalization to the edge of the numerical aperture. Equation (4.4) relates the measured quantities: change of displacement by change of defocus (dX/dZ, dY/dZ), with the unknown quantities of the pupil coordinates ($p_x$, $p_y$). This can be solved because there are two equations with two unknowns.

The amount of displacement that can be measured is limited by the capability of the overlay measurement tool. Typical maximum displacement equals ±5% of the outer frame size, i.e. 1.25 microns. In the case of $\theta = 45°$ (i.e. NA=0.7) this equals a defocus of ±1.25 microns.

The pupil locations corresponding to each outer frame obtained according to these measurements and calculations can be used in place of the geometrical optics approximations in an analysis the same as in equation 3 and subsequent paragraph in order to obtain aberration information, for example expressed as Zernike coefficients.

Embodiment 2

Equation (4.4) will give a pupil coordinate per frame, $$p_x(k,l), p_y(k,l)$$

This distribution over the frames can be fitted to a model, with the position of the filter (pinhole) (Dx, Dy, Dz) and the amount of spherical aberration (s) as unknown parameters. The model is:

$$Dx = k\text{-coeff}(1);$$

$$Dy = l\text{-coeff}(2);$$

$$Dz = \text{coeff}(3) - \text{coeff}(4)*(\sin(\tan^{-1}((rx^2+ry^2)^{1/2})))^2;$$

$$sx = rx - Dx./Dz;$$

$$sy = ry - Dy./Dz;$$

$$s = sx^2 + sy^2$$

where:
coeff(1) is the displacement in x direction (microns);
coeff(2) is the displacement in y direction (microns);
coeff(3) is the displacement in z direction (microns);
coeff(4) is the amount of axial spherical aberration within the defocused pinhole (microns);
k and l equal the position of the frame (microns); and
rx and ry equal the measured pupil coordinates within the distribution (5).

By applying this model and a fitting process, the actual position of the pinhole can be obtained, which means that the tolerances for the required positioning of the pinhole 18 with respect to the test pattern of outer frames on the mask MA can be relaxed. This greatly simplifies and cheapens the manufacture and positioning of the pinhole (or other filter).

Figure 8:
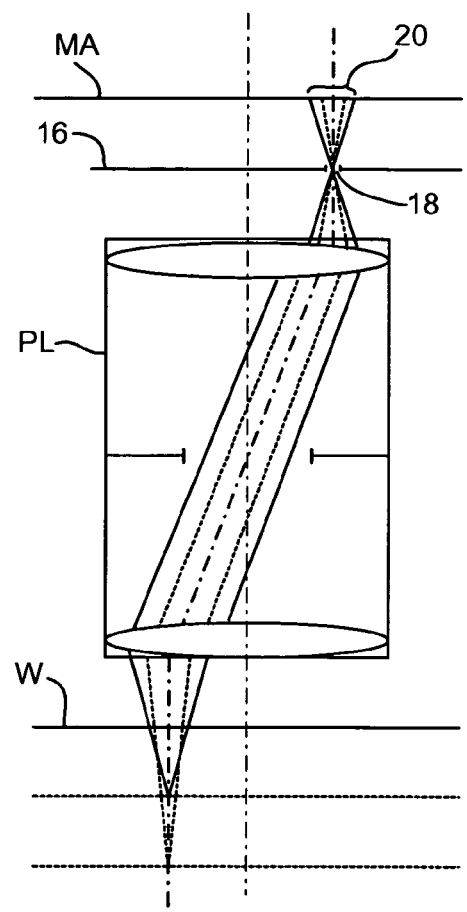

This embodiment of the invention also takes into account a further factor which can lead to inaccuracy in the aberration measurement. Referring to FIG. 8, the mask MA provides a regular array of outer frames in a measurement area 20 which is imaged at the substrate W. However, the pinhole 18 through which the radiation passes is defocused and this means that the image of the pinhole 18 will suffer from severe spherical aberration. As shown in FIG. 8, light subtending different angles at the pinhole 18 is focused at different distances from the plane of the substrate W. The occurrence of this effect is fundamental, even in the presence of perfect imaging optics. The consequence of this effect is that regularly arrayed outer frames at the mask 20 are no longer regularly arrayed at the substrate W. This effect causes extra shifts between inner and outer frame pairs across the test pattern images (FIG. 4).

According to one embodiment of the invention, these extra shifts are calibrated out of the projection lens aberration measurement because the pinhole spherical aberration is another parameter to be fitted. As explained previously, the Zernike coefficients are obtained using equation 3.

Empirically it has been found that the aberration measurement, i.e. Zernike coefficient calculation, is improved if points at a radial position corresponding to greater than 0.9 of the pupil diameter are disregarded.

After the aberration of the projection system has been calculated in accordance with the invention, correction can be applied to improve the imaging, for example by adjusting the position of certain lens elements in order to minimize wavefront aberrations. The lithographic apparatus can then be used to expose desired patterns onto target portions of a substrate. Repeated aberration measurements may need to be performed periodically to compensate for heating effects, drift and ageing of the apparatus.

While specific embodiments of the invention have been described above, it will be appreciated that the invention may be practiced otherwise than as described. The description is not intended to limit the invention. For example, inner and outer frames are merely examples of possible test patterns. The embodiments have described lens aberration in terms of Zernike polynomials and their coefficients, but this is merely one of many possible sets of functions which can be used to describe wavefront aberrations, and the present invention can be used to determine aberrations in terms of parameters other than Zernike coefficients. The above-described embodiments of the invention may be used separately or may be used in any suitable combination. The terms "first" and "second" used in reference to the test patterns are merely labels and do not imply any temporal sequence; the patterns can be imaged in either order. The first test pattern is also referred to as the reference test pattern herein.

What is claimed is:

1. A method of determining aberration of a projection system of a lithographic apparatus comprising:
projecting a reference test pattern in the lithographic apparatus;
projecting a second test pattern in the lithographic apparatus;
measuring relative displacements between items in resulting images of said reference test pattern and said second test pattern; and
determining information on the aberration of the projection system, using said measurements; and
supplying or making available the information to a device or user for analysis or for design or correction of a method or apparatus,
wherein projecting the second test pattern comprises filtering to select particular radiation paths through the projection system of the second test pattern, and
wherein the measuring is performed for a plurality of images of the second test pattern obtained at planes displaced along an optical axis relative to each other.

2. A method according to claim 1, further comprising calculating, for the plurality of images, a rate of change of displacement of portions of the second test pattern with respect to displacement along the optical axis.

3. A method according to claim 2, further comprising calculating a location in a pupil of the projection system traversed by the radiation for particular portions of the second test pattern using the calculated rate of change.

4. A method according to claim 1, wherein coordinates of a filter used for the filtering are included as variable parameters in the calculations for determining the aberration information.

5. A method according to claim 1, wherein spherical aberration introduced by a filter used for the filtering is included as a variable parameter in determining the aberration information.

6. A method of determining aberration of a projection system of a lithographic apparatus comprising:
projecting a reference test pattern in the lithographic apparatus;
projecting a second test pattern in the lithographic apparatus;
measuring relative displacements between items in resulting images of said reference test pattern and said second test pattern; and
determining information on the aberration of the projection system, using said measurements; and
supplying or making available the information to a device or user for analysis or for design or correction of a method or apparatus,
wherein projecting the second test pattern comprises filtering to select particular radiation paths through the projection system of the second test pattern, and
wherein coordinates of a filter used for the filtering are included as variable parameters in calculations for said determining.

7. A method of determining aberration of a projection system of a lithographic apparatus comprising:
projecting a reference test pattern in the lithographic apparatus;
projecting a second test pattern in the lithographic apparatus;
measuring relative displacements between items in resulting images of said reference test pattern and said second test pattern; and determining information on the aberration of the projection system, using said measurements; and supplying or making available the information to a device or user for analysis or for design or correction of a method or apparatus, wherein projecting the second test pattern comprises filtering to select particular radiation paths through the projection system of the second test pattern, and wherein spherical aberration introduced by a filter used for the filtering is included as a variable parameter in determining the aberration information.

8. A method according to claim 7, wherein the spherical aberration is used to correct the measured displacements between portions of the resulting images of said reference test pattern and said second test pattern.

9. A device manufacturing method comprising:

projecting a patterned beam of radiation onto a target portion of a substrate;

determining an aberration of a projection system used to project the patterned beam, comprising:

projecting a reference test pattern, projecting a second test pattern, the projecting of the second test pattern comprising filtering to select particular radiation paths through the projection system of the second test pattern, measuring relative displacements between items in resulting images of the reference test pattern and the second test pattern, and determining information on the aberration of the projection system, using said measurements, wherein (i) the measuring is performed for a plurality of images of the second test pattern obtained at planes displaced along an optical axis relative to each other, (ii) coordinates of a filter used for the filtering are included as variable parameters in calculations for said determining, (iii) spherical aberration introduced by a filter used for the filtering is included as a variable parameter in determining the aberration information, or (iv) any combination of (i)–(iii); and correcting for said aberration to reduce the aberration of the patterned beam projected onto the target portion of the substrate.

10. A method according to claim 6, wherein the measuring is performed for a plurality of images of the second test pattern obtained at planes displaced along an optical axis relative to each other and further comprising calculating, for the plurality of images, a rate of change of displacement of portions of the second test pattern with respect to displacement along the optical axis.

11. A method according to claim 10, further comprising calculating a location in a pupil of the projection system traversed by the radiation for particular portions of the second test pattern using the calculated rate of change.

12. A method according to claim 6, wherein spherical aberration introduced by a filter used for the filtering is included as a variable parameter in determining the aberration information.

13. A method according to claim 12, wherein the spherical aberration is used to correct the measured displacements between portions of the resulting images of said reference test pattern and said second test pattern.

14. A method according to claim 7, wherein the measuring is performed for a plurality of images of the second test pattern obtained at planes displaced along an optical axis relative to each other and further comprising calculating, for the plurality of images, a rate of change of displacement of portions of the second test pattern with respect to displacement along the optical axis.

15. A method according to claim 14, further comprising calculating a location in a pupil of the projection system traversed by the radiation for particular portions of the second test pattern using the calculated rate of change.

16. A method according to claim 5, herein the spherical aberration is used to correct the measured displacements between portions of the resulting images of said reference test pattern and said second test pattern.

17. A method according to claim 9, further comprising calculating, for the plurality of images, a rate of change of displacement of portions of the second test pattern with respect to displacement along the optical axis.

18. A method according to claim 17, further comprising calculating a location in a pupil of the projection system traversed by the radiation for particular portions of the second test pattern using the calculated rate of change.

19. A method according to claim 9, wherein the spherical aberration is used to correct the measured displacements between portions of the resulting images of the reference test pattern and the second test pattern.

* * * * *